US008084374B2

(12) United States Patent
Hayes et al.

(10) Patent No.: US 8,084,374 B2
(45) Date of Patent: Dec. 27, 2011

(54) TUNING OF PHOTO-ABSORPTION MATERIALS THROUGH USE OF MAGNETIC FIELDS

(75) Inventors: Sophia E. Hayes, St. Louis, MO (US); Stacy Mui, Dublin, CA (US); Kannan Ramaswamy, Hyderabad, IN (US)

(73) Assignee: Washington University in St. Louis, St. Louis, MO (US)

( * ) Notice: Subject to any disclaimer, the term of this patent is extended or adjusted under 35 U.S.C. 154(b) by 0 days.

(21) Appl. No.: 12/950,816

(22) Filed: Nov. 19, 2010

(65) Prior Publication Data

US 2011/0124205 A1     May 26, 2011

Related U.S. Application Data

(60) Provisional application No. 61/262,753, filed on Nov. 19, 2009.

(51) Int. Cl.
*H01L 21/00*     (2006.01)
(52) U.S. Cl. ............... 438/795; 438/3; 257/E21.328
(58) Field of Classification Search ............ 438/795
See application file for complete search history.

(56) References Cited

U.S. PATENT DOCUMENTS

| 3,922,560 | A | 11/1975 | Wolff |
|---|---|---|---|
| 5,148,444 | A | 9/1992 | Berger |
| 6,762,071 | B2 | 7/2004 | Eliasson et al. |
| 7,430,074 | B2 | 9/2008 | Korenblit et al. |
| 7,440,178 | B2 | 10/2008 | Korenblit et al. |
| 7,457,033 | B2 | 11/2008 | Cole et al. |
| 7,471,449 | B2 | 12/2008 | Korenblit et al. |
| 7,601,977 | B2 | 10/2009 | Yeh et al. |
| 7,706,056 | B2 | 4/2010 | Korenblit et al. |
| 2004/0014244 | A1* | 1/2004 | Sato et al. ............... 438/3 |
| 2008/0002250 | A1 | 1/2008 | Korenblit et al. |

OTHER PUBLICATIONS

Zverev et al, Investigations of the Absorption Edge InP in a Strong Magnetic Field, 1975, Phys. Stat. Sol, 68, p. 93-97.*
Savic, I. et al; Dilute Magnetic Semiconductor Quantum-Well Structures for Magnetic Field Tunable Far-Infrared/Terahertz Absorption; IEEE Journal of Quantum Electronics; Nov. 2004; pp. 1614-1621; vol. 40, No. 11.

* cited by examiner

*Primary Examiner* — Ha Tran T Nguyen
*Assistant Examiner* — Valerie N Brown
(74) *Attorney, Agent, or Firm* — Armstrong Teasdale LLP

(57) ABSTRACT

The disclosure relates to using magnetic fields for the purposes of modifying the absorption characteristics of materials, such as semiconductor materials, to both tune the materials to specific wavelengths and to enhance the absorption of the materials by concentrating the continuum of states of the conduction and valence bands into magnetic field-dependent Landau levels.

20 Claims, 5 Drawing Sheets

TUNING OF PHOTO-ABSORPTION MATERIALS THROUGH USE OF MAGNETIC FIELDS

CROSS REFERENCE TO RELATED APPLICATION

This application claims priority to U.S. provisional patent application No. 61/262,753 filed Nov. 19, 2009, which is incorporated herein in its entirety.

BACKGROUND

The desire for new renewable energy sources has created areas of intense research activity, particularly in the field of photovoltaic materials for solar power generation. The basic principle employed in converting solar energy to electrical energy is the photovoltaic effect—when sunlight strikes photovoltaic cells (PV) made up of a material, such as a semiconductor material, for example, a fraction of it is absorbed by the material depending upon the material's bandgap. The absorbed energy causes electrons in the material to become delocalized (i.e., free to move), and this flow of electrons creates an electric current that can be harnessed. For example, at the interface between n-type and p-type regions of a semiconductor material, an electric field is created by charges in a depletion region. The incident photons on the photodiode surface penetrate the material and generate electron-hole pairs at different depths. The generated electron-hole pairs give rise to a photo current in the material. The electrons subsequently leave the material through a metallic contact at the surface of the material, and these electrons pass through an external load.

Typically, it has been known that efficiencies of only 5-25% can be achieved in part because absorption across a wide range of photon energies by a single material is a fundamentally inefficient process, limited by the absorption characteristics of the material. The photon energy-dependent absorption can strongly affect the penetration depth of the radiation and, subsequently, the interaction with the depletion region. This interaction is a critical aspect of cell performance.

SUMMARY

In one aspect of the present disclosure, a method of tuning a photon energy-dependent absorption coefficient of a light-sensitive material through use of a magnetic field comprises applying a magnetic field to the light-sensitive material to shift an absorption edge wavelength of the light-sensitive material to a pre-determined wavelength, wherein the shift of the absorption edge wavelength increases light absorption of the light-sensitive material at particular wavelengths.

Another aspect of the present disclosure is directed to a method of enhancing photo-absorption of a light-sensitive material through use of a magnetic field. The method comprises applying a magnetic field to the light-sensitive material to split a continuum of states of conduction bands in the light-sensitive material and a continuum of states of valence bands in the light-sensitive material into magnetic field-dependent Landau levels.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

FIG. 5 further depicts the splitting of the conduction band and one of the two valence bands of GaAs into sub-states when a magnetic field is being applied.

DETAILED DESCRIPTION

Figure 1:
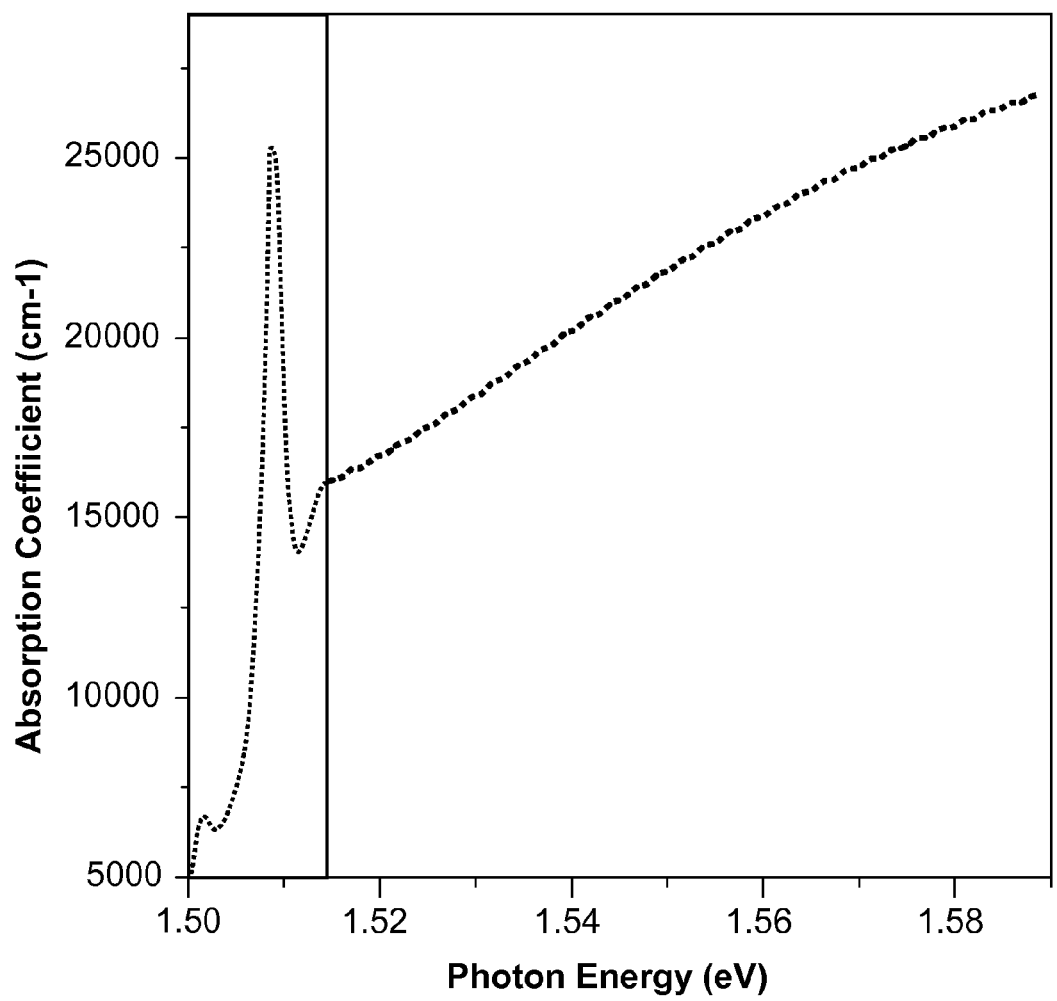
FIG. 1 is a graphical depiction of the approximate optical absorption (measured as optical extinction, assuming negligible losses due to scattering) of GaAs vs. photon energy measured at 4 K with no applied magnetic field.
Figure 2:
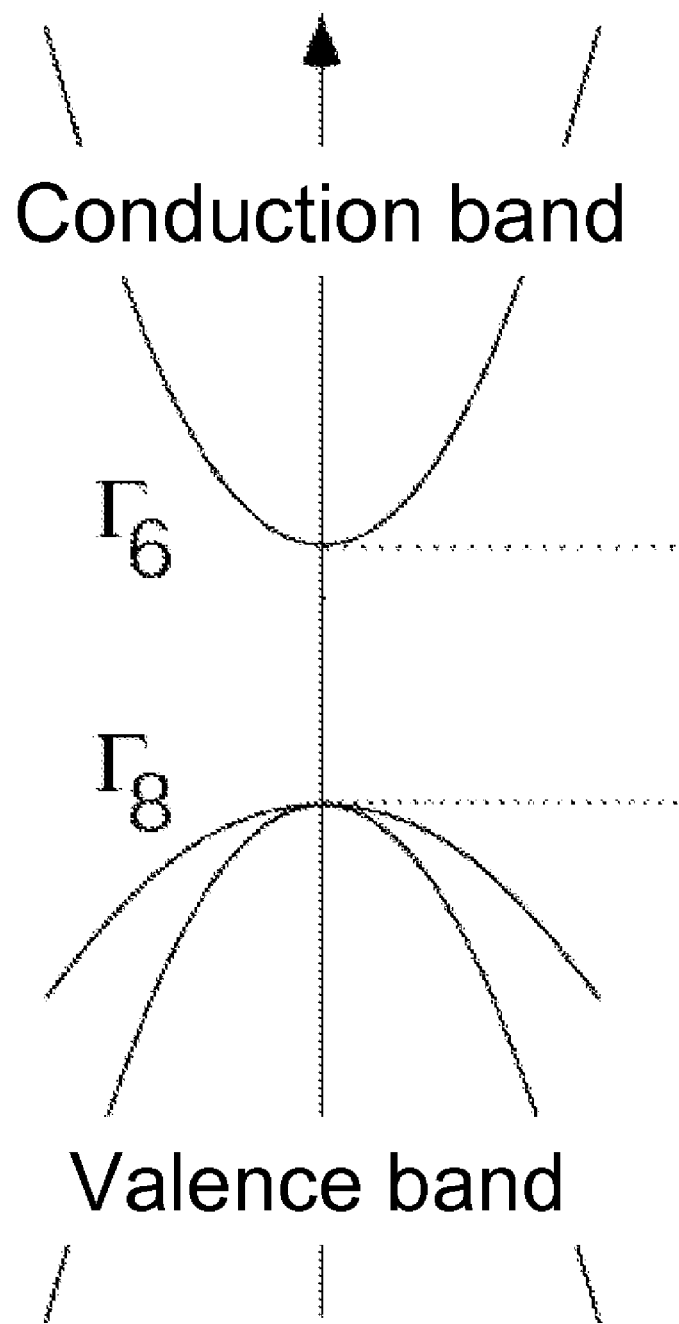
FIG. 2 depicts the partial bandstructure of GaAs at the Gamma point with energy as the vertical axis and the wavevector "k" as the horizontal axis.

In accordance with the present disclosure, it has been discovered that magnetic fields may be used for the purpose of modifying the absorption characteristics of light-sensitive materials, such as semiconductor materials, to both tune the light-sensitive materials to specific wavelengths and to enhance the absorption of the light-sensitive materials by concentrating the continuum of states of the conduction and valence bands into magnetic field-dependent Landau levels.

In some embodiments of the present disclosure, it is possible to cover a larger region of the wavelength spectrums in a light-sensitive material by tuning the photovoltaic cells to absorb a wider range of wavelengths than that compatible with a single absorber, and to enhance the photo-absorption of a light-sensitive material. As a result, next-generation materials, such as solar devices, can be engineered to incorporate new materials and new concepts for better operating efficiency.

Exemplary Methods for Tuning a Photon Energy-Dependent Absorption Coefficient

According to some embodiments of the present disclosure, a method of tuning a photon energy-dependent absorption coefficient of a light-sensitive material through use of a magnetic field is disclosed. The method comprises applying a magnetic field to the light-sensitive material to shift an absorption edge wavelength of the light-sensitive material to a pre-determined wavelength, and further wherein the shift of the absorption edge wavelength to the pre-determined wavelength increases light absorption of the light-sensitive material at specific wavelengths.

Without being bound to any particular theory, it is believed that materials in magnetic fields exhibit different absorption coefficients as a function of photon energy and magnetic field strength. This phenomena is known in the art as "magneto-absorption." The magnetic field-dependent coefficient of a material is conventionally expressed as α (E), where E is the photon energy. It is believed that the magnetic field-dependent absorption coefficient allows the absorption edge wavelength of a material to be shifted to a slightly higher energy and shorter wavelengths in a pre-determined manner if a magnetic field is applied. The absorption edge wavelength of a material is the wavelength at which the material begins absorbing radiation in the absence of a magnetic field. The region of energy where the material absorbs radiation is being shifted by the magnetic field. Once the magnetic field ceases to be applied, it is believed that the absorption edge wavelength returns rapidly to its original state.

The absorption edge wavelength can be shifted to a pre-determined wavelength within the solar spectrum, the infrared spectrum or the ultraviolet spectrum in order to increase light absorption of the material. The pre-determined wavelength depends upon the light-sensitive material that the magnetic field is being applied to, as well as the amount of light absorption desired by the user. By shifting the absorption edge wavelength of a material, it is possible to better capture the energy, for example, from sunlight, to enable the material to operate at higher efficiencies. Further, it is possible to increase the light absorption of the light-sensitive material by shifting the absorption edge wavelength.

In some embodiments, the light-sensitive material is selected from the group consisting of semiconductor materials, optoelectronic devices, multiple junction solar cells, tandem devices, photovoltaic cells, photodetectors and thin film devices. In some embodiments, the light-sensitive material is a semiconductor material.

Exemplary semiconductor materials can be selected from the group consisting of gallium arsenide (GaAs), indium phosphide (InP), cadmium telluride (CdTe), germanium (Ge), indium gallium phosphide ($In_xGa_yP_z$), and silicon (Si). In some embodiments, the semiconductor material is GaAs.

When applying the magnetic field to the light-sensitive material, in some embodiments the magnetic field is a non-zero magnetic field, that is, a magnetic field greater than 0 T. In some embodiments, the magnetic field being applied is at least about 2 T. In another embodiment, the magnetic field being applied is about 4.7 T. In yet another embodiment, the magnetic field being applied is about 7 T.

In some embodiments, the pre-determined wavelength to which the absorption edge wavelength is being shifted is in the range of from about 200 nm to about 3000 nm. That is, the absorption edge wavelength is being shifted to a wavelength within the range of from about 200 nm to about 3000 nm. In some embodiments, the pre-determined wavelength is from about 770 nm to about 850 nm.

In another embodiment, the method is conducted at relatively very low temperatures. In some embodiments, the method is conducted at a temperature of greater than about 4 K.

Without being bound to any particular theory, it is believed that the amount of the light absorption of the light-sensitive material can be increased by a quantifiable number.

FIG. 1 depicts the absorption of a GaAs semiconductor material compared to the photon energy measured at 4 K without a magnetic field being applied. As can be seen in FIG. 1, the excitonic peak of the GaAs is about 1.51 electron volts (eV). The excitonic peak is located near the absorption edge wavelength of the GaAs semiconductor material.

Figure 3:
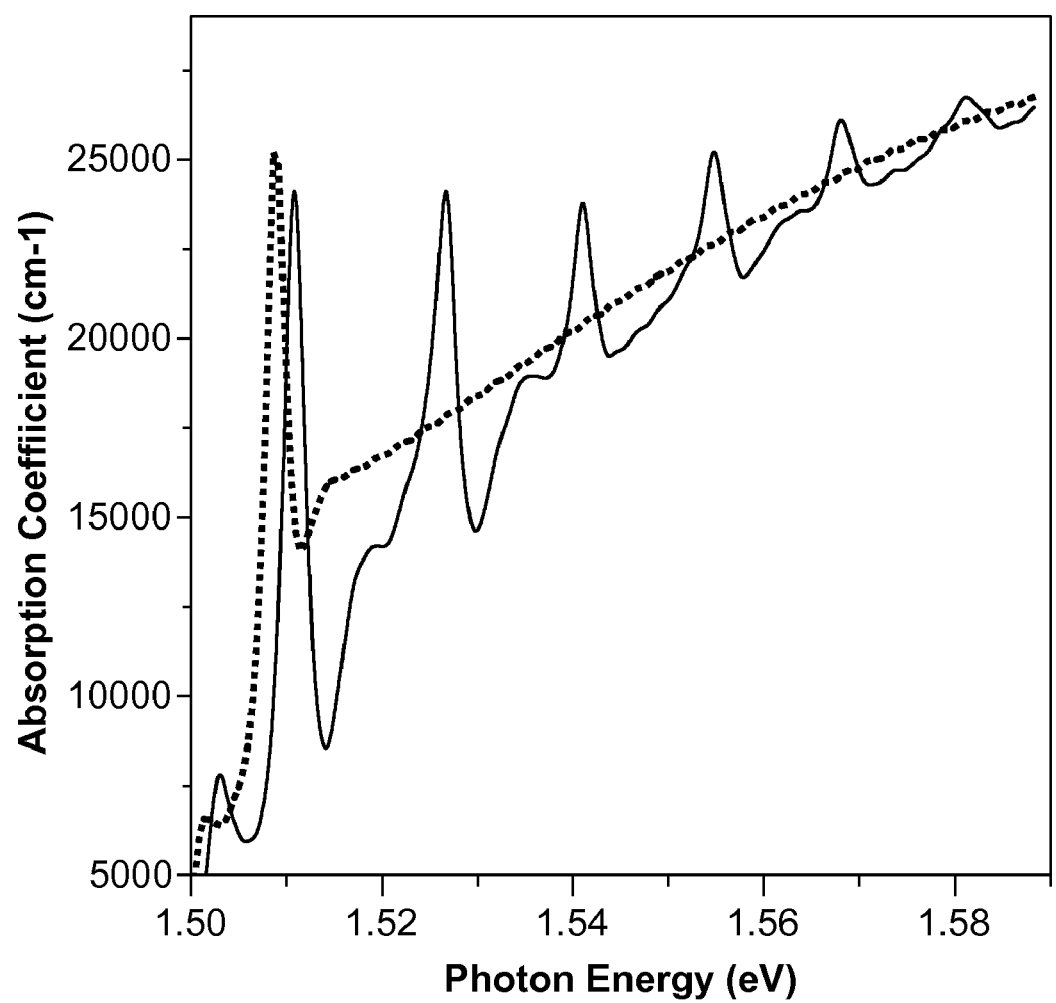
FIG. 3 is a graphical depiction of the approximate optical absorption (measured as optical extinction, assuming negligible losses due to scattering) of GaAs at low temperature as a function of photon energy at zero field (dotted line) and in the presence of a magnetic field at about 4.7 T (solid line).
Figure 4:
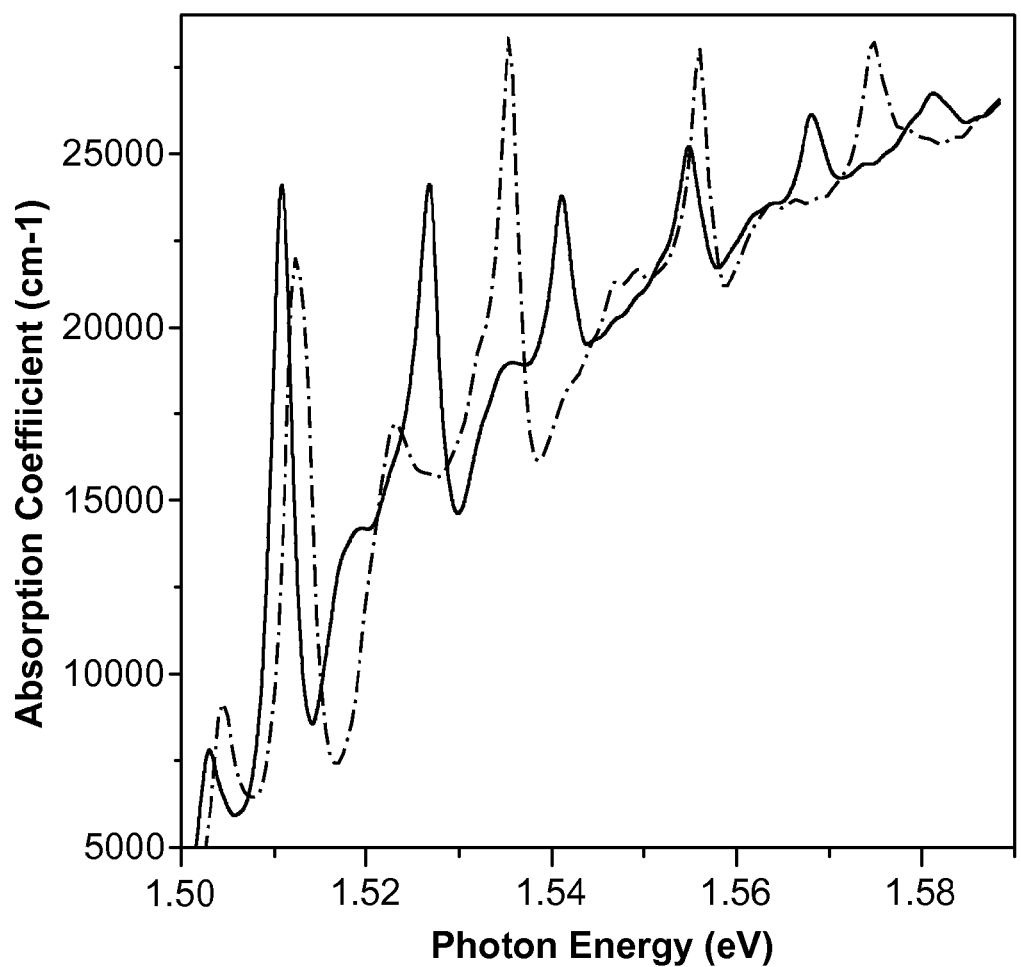
FIG. 4 is a graphical depiction of the approximate optical absorption (measured as optical extinction, assuming negligible losses due to scattering) of GaAs at a relatively low temperature as a function of photon energy in the presence of a magnetic field of about 4.7 T (solid line) and about 7 T (dotted line).

FIG. 3 depicts that when an external magnetic field of about 4.7 T is applied to the GaAs semiconductor material (indicated by the solid line), the absorption edge wavelength, along with the excitonic peak, shifts in energy. Further evidence of this phenomenon is illustrated in FIG. 4, which depicts the shifting in energy of the absorption edge wavelength and excitonic peaks even further when a magnetic field of about 7 T is applied to the GaAs semiconductor material (indicated by the dashed line). Thus, it is believed that the stronger the magnetic field, the more the absorption edge wavelength, along with the excitonic peak, shifts.

It is believed that the disclosed method provides for better capture of the energy from sunlight and, subsequently, enables light-sensitive materials, such as solar cells, to operate at higher efficiencies. Such an approach can be useful when used within the activities for solar cell developments involving optical spectrum shifting. Non-limiting examples of areas that the disclosed method could impact through optical spectrum shifting in order to better capture the radiant energy of the sunlight include areas of solar conversion technology, including but not limited to biologically-based solar conversion, as well as organic or photochemical conversion of sunlight.

For example, the disclosed method can create greater efficiency in tandem devices or multiple junction solar cells, which consist of multiple, single junction solar cells joined together. For materials that allow high efficiency performance through choice of optimal band gaps, the disclosed method would allow the bandgaps and/or absorption edge wavelengths of the materials to be tuned by application of an external magnetic field in order to shift the bandgaps and/or absorption edge wavelengths into a desirable range.

Exemplary Methods for Enhancing Photo-Absorption

According to another embodiment of the present disclosure, a method of enhancing photo-absorption of a light-sensitive material through use of a magnetic field is disclosed. The method comprises applying a magnetic field to the light-sensitive material, wherein the magnetic field splits a continuum of states of conduction bands in the light-sensitive material and a continuum of states of valence bands in the light-sensitive material into magnetic field-dependent Landau levels.

Without being bound to any particular theory, it is believed that when no external magnetic field is being applied to a material, a continuum of states exists in the conduction bands and the valence bands of the material. It is further believed that an excitonic state lies just below the edge of the conduction band near the Gamma-6 point. It is also believed that the continuum of states is created by the near-limitless number of transitions available at high photon energies.

When an external magnetic field is applied to a material, such as a light-sensitive material, as disclosed herein, the continuum of states of the conduction bands and the valence bands of the light-sensitive material split into a series of states due to the Zeeman splitting of spin states into Landau levels. "Peaks" and "valleys" in the absorption spectrum are believed to arise from the selection rules for Landau level transitions.

It is further believed that when the absorption of a material is peaked at certain Landau levels, the absorption of the light-sensitive material is enhanced at those particular wavelengths relative to the continuum, which, in turn, can lead to an enhanced absorption cross-section and shallow penetration depths of the light-sensitive material. The continuum of states of the conduction bands and the valence bands are compressed into periodic, magnetic-field dependent Landau levels that enhance the absorption of the light-sensitive material in those narrow bands relative to zero-field absorption.

In some embodiments, the light-sensitive material is selected from the group consisting of semiconductor materials, optoelectronic device materials, multiple junction solar cells, tandem devices, photovoltaic cells, photodetectors and thin film devices. In some embodiments, the light-sensitive material is a semiconductor material.

Exemplary semiconductor materials can be selected from the group consisting of gallium arsenide (GaAs), indium phosphide (InP), cadmium telluride (CdTe), germanium (Ge), indium gallium phosphide ($In_xGa_yP_z$), and silicon (Si). In some embodiments, the semiconductor material is GaAs.

When applying the magnetic field to the light-sensitive material, in some embodiments, the magnetic field is a non-zero magnetic field, that is, the magnetic field is greater than 0 T. In some embodiments, the magnetic field being applied is at least about 2 T. In another embodiment, the magnetic field being applied is about 4.7 T. In yet another embodiment, the magnetic field being applied is about 7 T.

In some embodiments, a spacing between the Landau levels depends on the magnetic field and an effective mass of a conduction electron.

In another embodiment, the method is conducted at relatively very low temperatures. In some embodiments, the method is conducted at a temperature of greater than about 4 K.

FIG. 1 depicts a conventional optical absorption spectrum from a GaAs semiconductor material, with no applied external magnetic field. As used in the present disclosure, "optical absorption" generally refers to a measure of the amount of light absorbed by a sample; and, "optical extinction" generally refers to a measure of light transmitted through a sample, which serves to measure the absorbance of a sample in addition to other factors, which can lead to reduced transmittance of light (e.g., scattering or luminescence). As can be seen in FIG. 1, a continuum of states for the conduction bands and the valence bands exists from about 1.51 eV to about 1.58 eV. FIG. 3 depicts the optical absorption of a GaAs semiconductor material at a relatively low temperature as a function of photon energy at both a zero field (indicated by the dotted line) and in the presence of a magnetic field of about 4.7 T (indicated by the solid line). As can be seen in FIG. 3, the continuum of states of conduction bands and valence bands splits into bands of high and low absorptivity as a function of photon energy. Specifically, where there were no Landau level features in the absence of a magnetic field, when the magnetic field of about 4.7 T is applied to the GaAs semiconductor material, Landau level features arise at about 1.53, 1.54, 1.56, 1.57 and 1.58 eV.

FIG. 4 depicts that the continuum of states splits up even further as a stronger magnetic field is applied. As the magnetic field is raised from about 4.7 T (indicated by the solid line) to about 7 T (indicated by the dashed line), the absorption peaks of the GaAs semiconductor material shift to a higher energy (eV).

Figure 5:
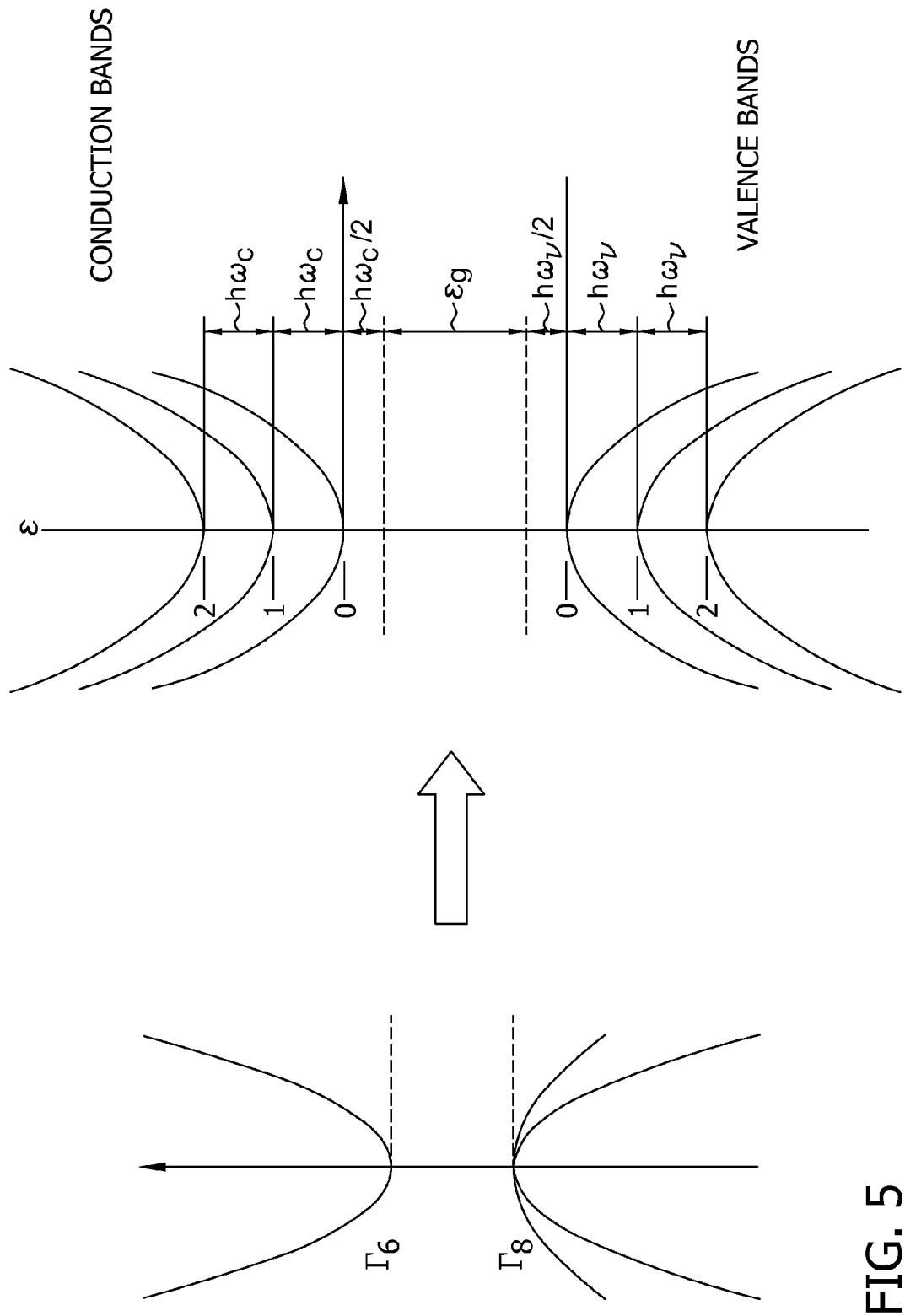
FIG. 5 depicts the partial bandstructure of GaAs with energy as the vertical axis and the wavevector "k" as the horizontal axis.

FIG. 5 depicts a conduction band and a valence band with no external magnetic field being applied and with an external magnetic field being applied. As is known in the art, in FIG. 5, at a zero magnetic field, the conduction and valence bands possess a continuum of states. FIG. 5 depicts the splitting of the conduction band when a nonzero magnetic field is being applied to a GaAs semiconductor material. As can be seen in FIG. 5, the conduction band splits into various Landau levels at different energy (eV) measurements. Similarly, FIG. 5 schematically depicts the splitting of one of the valence bands when a nonzero magnetic field is being applied. As can be seen in FIG. 5, the valence bands split into various Landau levels with respect to energy (eV).

EXEMPLARY PROCEDURE

The process of the present disclosure may be carried out, for example, by the operations further detailed herein below.

For example, Task 1 of the present disclosure can include focusing on photocurrent generation from commercial semiconductor material samples in high magnetic fields ranging from about 1-7 Tesla with tunable light sources. Exemplary mechanisms for tuning the light sources are lasers and arc lamps, both of which are known in the art.

Semiconductor material samples can be doped, for example in silicon, or, undoped. In addition to silicon, other exemplary semiconductor materials include Ge, GaAs, CdTe, $In_xGa_yP_z$, and the like. Various silicon imaging arrays composed of different photosensitive structures, such as photodiodes, photogates and phototransistors, are fabricated via regular semiconductor foundries known in the art, such as the Taiwan Semiconductor Company (TSMC) and American International Semiconductors (AMIS). Task 1 assists in understanding the role of magnetic fields in altering the absorption characteristics of both monochromatic and polychromatic light.

Task 2 can involve the custom fabrication of magnetic-semiconductor hybrid structures, which can be performed at exemplary microfabrication and nanofabrication facilities known in the art. The custom fabrication is divided into two phases. During the first phase, several different photosensitive structures are designed based on previous imaging sensor designs. These structures are fabricated by AMIS foundry in 0.5 micron technology. The fabrication of the integrated circuit is mitigated by the Metal Oxide Semiconductor Implementation Service (MOSIS). The total area of the test chip is 1.5 mm by 1.5 mm and is populated with several photosensitive structures, which are routed to pads for testing purposes. During the second phase, post-processing is conducted on the fabricated integrated circuit, which facilitates depositing and/or growing magnetic materials around the photosensitive structures. The post-processing can be conducted in any nanofabrication facility known in the art.

The photodiode structure created during the custom fabrication is composed of n-doped silicon in a p-doped substrate, with an area of 100 microns by 100 microns and a depth of 5 microns. The area of the photodiode can be varied and multiple different junction areas can be evaluated. The first operation to create the photodiode structure involves fabricating trenches around the photodiode structure using a series of photolithography and reactive ion etching. Various trench patterns can be explored in order to evaluate which trench pattern will lead to the optimum magnetic field. The second operation to create the photodiode structure involves depositing a magnetic material within the trenches in order to create the desired magnetic properties across the photosensitive junction. By doing so, it is possible to create simple architectures based on the multi junction solar cell, using magnetic fields to tune the materials across a desired range of absorption energies.

Task 3 of the present disclosure involves correlating sample-specific α(E) data with different photon-energy Optically Pumped Nuclear Magnetic Resonance (OPNMR) profiles. Different samples of exemplary semiconductor materials show a high degree of variability in the bandedge region. Elemental doping of semiconductor materials imparts p-type and n-type characteristics, which, in turn, can strongly influence carrier recombination in the depletion layer (region) of the semiconductor material. Generally, it is believed that doping is not uniform in most devices, but, rather, relies on ion implantation processes to carry the implanted dopants into the semiconductor material. The impact of such doping on the magnetoabsorption characteristics can be an input into design of future semiconductor materials.

Task 4 of the present disclosure involves making precise measurements on samples and refining their models for optical absorption by examining the individual Landau level transitions. Bulk semiconductor materials at a zero field can depart from current models in the presence of magnetic fields. Transitions can be consistent with pure light-hole or heavy-hole valence band states to the corresponding conduction states. Such refining can provide opportunities for more precise tuning of optical absorption of various device applications.

The following examples further illustrate the present disclosure.

EXAMPLE 1

Magnetoabsorption of GaAs

FIG. 3 (solid line) depicts the magnetoabsorption of GaAs when a magnetic field is applied. Specifically, when no magnetic field is being applied, the excitonic peak of the GaAs is just below about 1.51 eV in this sample (indicated by the dotted line). When a magnetic field of about 4.7 T is applied to the GaAs, however, the excitonic peak shifts to a photon energy of above about 1.51 eV, and other features corresponding to transitions between Landau levels are observed at about 1.53 eV, about 1.54 eV, about 1.55 eV and about 1.56 eV (indicated by the solid line).

EXAMPLE 2

Magnetoabsorption of GaAs

FIG. 4 depicts the magnetoabsorption of GaAs when a magnetic field is applied. Specifically, a magnetic field of about 4.7 T (indicated by the solid line) and a magnetic field of about 7 T (indicated by the dashed line) are applied to the GaAs light-sensitive material. The results display that the greater the magnetic field applied to the GaAs, the greater the amount of shift in photon energy of the excitonic peak of the GaAs and shift in the transitions between Landau levels.

EXAMPLE 3

Band Structure Modification by a Magnetic Field

FIG. 5 depicts the conduction band and the valence band structure of a light-sensitive GaAs material when no magnetic field is being applied (i.e., $B_0=0$ T) and when a magnetic field is being applied. When no magnetic field is being applied, there exists a continuum of states in the conduction band and a continuum of states in the valence band. As can be seen in FIG. 5, when a magnetic field of about 7 T is applied to the GaAs material, the continuum of states of the conduction band splits into discrete states at different energy levels. Further, as can be seen in FIG. 5, the continuum of states of the valence band splits into discrete states as well. The spacing between the Landau levels is dependent upon the amount of magnetic field being applied ($B_0$) and the effective mass of the conduction electron. The effective mass of the conduction electron is specific to each light-sensitive material (such as a semiconductor material).

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A method of tuning a photon energy-dependent absorption coefficient of a light-sensitive material through use of a magnetic field, comprising:
applying a magnetic field to the light-sensitive material such that a plurality of magnetic field-dependent Landau levels shift with the magnetic field to shift an absorption edge wavelength of the light-sensitive material to a pre-determined wavelength and to facilitate a shift in an absorption maxima, wherein the shift of the absorption edge wavelength to the pre-determined wavelength increases light absorption of the light-sensitive material at specific wavelengths.

2. The method of tuning a photon energy-dependent absorption coefficient of a light-sensitive material as set forth in claim 1, wherein the light-sensitive material is selected from the group consisting of semiconductor materials, optoelectronic device materials, multiple junction solar cells, tandem device materials, photovoltaic cells, photodetectors and thin film device materials.

3. The method of tuning a photon energy-dependent absorption coefficient of a light-sensitive material as set forth in claim 2, wherein the light-sensitive material is a semiconductor material.

4. The method of tuning a photon energy-dependent absorption coefficient of a light-sensitive material as set forth in claim 3, wherein the semiconductor material is selected from the group consisting of gallium arsenide (GaAs), indium phosphide (InP), cadmium telluride (CdTe), germanium (Ge), indium gallium phosphide ($In_xGa_yP_z$), and silicon (Si).

5. The method of tuning a photon energy-dependent absorption coefficient of a light-sensitive material as set forth in claim 4, wherein the semiconductor material is gallium arsenide (GaAs).

6. The method of tuning a photon energy-dependent absorption coefficient of a light-sensitive material as set forth in claim 1, wherein the magnetic field is at least about 2 T.

7. The method of tuning a photon energy-dependent absorption coefficient of a light-sensitive material as set forth in claim 1, wherein the magnetic field is about 4.7 T.

8. The method of tuning a photon energy-dependent absorption coefficient of a light-sensitive material as set forth in claim 1, wherein the magnetic field is about 7 T.

9. The method of tuning a photon energy-dependent absorption coefficient of a light-sensitive material as set forth in claim 1, wherein the method is conducted at a temperature of greater than about 4K.

10. The method of tuning a photon energy-dependent absorption coefficient of a light-sensitive material as set forth in claim 1, wherein the pre-determined wavelength is from about 200 nm to about 3000 nm.

11. The method of tuning a photon energy-dependent absorption coefficient of a light-sensitive material as set forth in claim 1, wherein the pre-determined wavelength is from about 770 nm to about 850 nm.

12. A method of enhancing photo-absorption of a light-sensitive material through use of a magnetic field, comprising:
applying a magnetic field to the light-sensitive material to split a continuum of states in a conduction band in the light-sensitive material and to split a continuum of states in a valence band in the light-sensitive material into a plurality of magnetic field-dependent Landau levels that shift with the magnetic field to facilitate a shift in an absorption maxima.

13. The method of enhancing photo-absorption of a light-sensitive material as set forth in claim 12, wherein the light-sensitive material is selected from the group consisting of semiconductor materials, optoelectronic device materials, multiple junction solar cells, tandem device materials, photovoltaic cells, photodetectors and thin film device materials.

14. The method of enhancing photo-absorption of a light-sensitive material as set forth in claim 13, wherein the light-sensitive material is a semiconductor material.

15. The method of enhancing photo-absorption of a light-sensitive material as set forth in claim 14, wherein the semiconductor material is selected from the group consisting of gallium arsenide (GaAs), indium phosphide (InP), cadmium telluride (CdTe), germanium (Ge), indium gallium phosphide ($In_xGa_yP_z$), and silicon (Si).

16. The method of enhancing photo-absorption of a light-sensitive material as set forth in claim 15, wherein the semiconductor material is gallium arsenide (GaAs).

17. The method of enhancing photo-absorption of a light-sensitive material as set forth in claim 12, wherein the magnetic field is at least about 2 T.

18. The method of enhancing photo-absorption of a light-sensitive material as set forth in claim 12, wherein the magnetic field is about 4.7 T.

19. The method of enhancing photo-absorption of a light-sensitive material as set forth in claims 12, wherein the magnetic field is about 7 T.

20. The method of enhancing photo-absorption of a light-sensitive material as set forth in claim 12, wherein the method is conducted at a temperature of greater than about 4K.

* * * * *